United States Patent
Szczeszynski et al.

(10) Patent No.: US 7,110,718 B1
(45) Date of Patent: Sep. 19, 2006

(54) PHASE DISTORTION USING MOS NONLINEAR CAPACITANCE

(75) Inventors: Gregory Krzystof Szczeszynski, Nashua, NH (US); Jean-Marc Mourant, Groton, MA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 515 days.

(21) Appl. No.: 10/457,242

(22) Filed: Jun. 9, 2003

(51) Int. Cl.
*H04B 7/165* (2006.01)

(52) U.S. Cl. .................. 455/23; 455/114.1; 455/114.3; 455/127.1; 327/210; 327/389; 327/284; 330/107; 330/149; 330/151; 330/294; 330/302; 330/307

(58) Field of Classification Search .................. 455/23, 455/114.1, 114.3, 127.1, 127.2; 327/210, 327/389, 391, 284; 330/107, 149, 151, 294, 330/302, 307; 375/284; 257/213, 212
See application file for complete search history.

(56) References Cited

U.S. PATENT DOCUMENTS

| 2,805,398 A | * | 9/1957 | Albersheim | ................. | 336/75 |
| 2002/0071452 A1 | * | 6/2002 | Abraham | ................. | 370/480 |

OTHER PUBLICATIONS

Merrimac Industries, Inc., "Quadrature Hybrids 90° Power Dividers/Combiners 10 kHz to 40 GHz General Information", Mar. 21, 1996.
Jeong, Yong-Chae et al., "Design of a Predistortive High Power Amplifier Using Carrier Complex Power Series Analysis", Microwave Journal, Apr. 2002, pp. 92, 94-96, 98, 101, 102.

* cited by examiner

*Primary Examiner*—Nay Maung
*Assistant Examiner*—Shaima Q. Aminzay
(74) *Attorney, Agent, or Firm*—Blakely Sokoloff Taylor & Zafman LLP

(57) ABSTRACT

RF phase distortion circuits and methods for controllably phase distorting an RF signal based on amplitude of the RF signal. An MOS device is provided having a body of a first conductivity type and at least one region of a second conductivity type in the body, with a conductive layer over at least part of the body and the region of the second conductivity type and insulated therefrom. The MOS device may be coupled into a phase distortion circuit individually or in back-to-back pairs and biased to invert the body under the conductive layer for small signal amplitudes and not for large signal amplitudes, or to not invert the body under the conductive layer for small signal amplitudes and to invert the body under the conductive layer for large signal amplitudes. Various embodiments are disclosed.

23 Claims, 4 Drawing Sheets

Basic Design of a Phase Distorter

Cross Section of a MOS Transistor

Cgs to Cg variation (Cgs+Cgd) to Cg variation

Cgd to Cg variation

Symmetrical double MOS for even order cancelation

Basic Design of a Phase Distorter

PHASE DISTORTION USING MOS NONLINEAR CAPACITANCE

BACKGROUND OF THE INVENTION

1. Field of the Invention

The present invention relates to the field of amplitude and phase distortion circuits, and more particularly to phase distortion circuits for distorting the instantaneous phase of a signal.

2. Prior Art

RF amplifiers such as power amplifiers are typically subject to both phase distortion and amplitude distortion in the RF signal. Such distortion is characterized by increasing distortion at increasing instantaneous RF signal magnitudes. To reduce this distortion, the RF signal may be subjected to offsetting pre-distortion to try to negate the effects of the distortion. Similar effects can also be obtained by applying an offsetting post-corrective distortion to an already distorted RF signal. Preferably, independent control of phase distortion and amplitude distortion would be provided to simplify the pre-distortion or post-distortion process and improve its effectiveness.

An ideal phase distorter would be a device that would alter the phase of a signal as a function of the signal's voltage/power level without affecting the amplitude. Presently the only known RF distorter is an RF gain/phase distorter which creates both amplitude and phase distortion as a function of the RF signal amplitude. The gain and phase distortion are not independent, which limits the improvement in performance these blocks can provide. The use of a pure phase distorter would allow for independent control of both phase and gain distortion to greatly improve their benefit to the RF system performance. Currently, independent gain distortion circuits are available, but independent RF phase distortion circuits are not.

DETAILED DESCRIPTION OF THE PREFERRED EMBODIMENTS

The present invention comprises phase distorters utilizing MOS type devices to create a nonlinear response to a large input signal. The nonlinear response can be characterized as an impedance that varies as a function of the input power. The MOS device creates an impedance variation that is more reactive than a similar impedance variation created by other devices such as BJT transistors. This more "reactive" variation facilitates the design of phase distorters for use in pre/post-distortion applications. While certain pre/post-distortion circuits that are sensitive to an impedance that varies as a function of the input power are subsequently disclosed herein, it is to be understood that such circuits are exemplary only, and other distortion circuits will be obvious to those skilled in the art.

The impedance of a MOS transistor varies as a function of the instantaneous input signal voltage. This creates distortion around the applied signal's frequency and facilitates the design of RF phase distorters. This is in contrast to baseband distorters that respond to the envelope of the signal and create distortion around the baseband frequency. Currently, while independent gain distortion circuits are known, there are no known RF phase distorters available.

Figure 1:
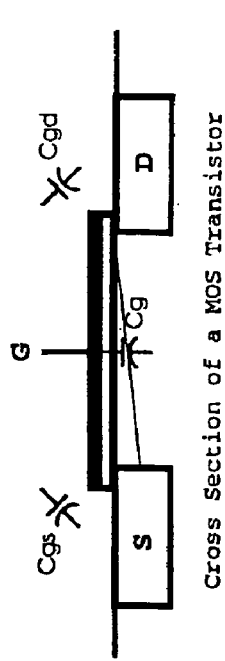
FIG. 1 is a schematic cross section of an exemplary MOS transistor.
Figure 2:
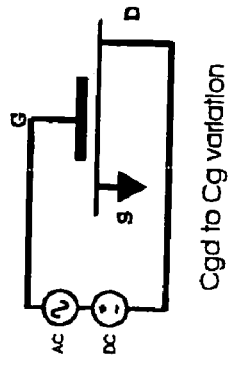
FIG. 2 is a schematic diagram of a MOS transistor illustrating a nonlinear capacitance effect with signal and bias levels for the parallel combination of the gate to source and gate to channel capacitances.
Figure 4:
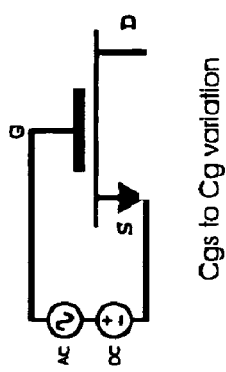
FIG. 4 is a schematic diagram of a MOS transistor illustrating a nonlinear capacitance effect with signal and bias levels for the parallel combination of the gate to source, gate to drain and gate to channel capacitances.
Figure 3:
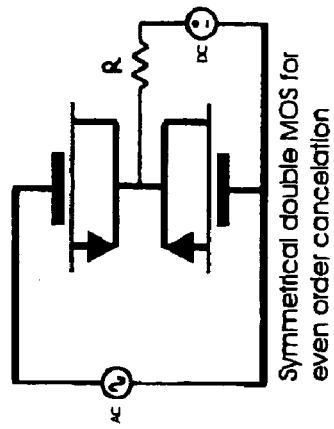
FIG. 3 is a schematic diagram of a MOS transistor illustrating a nonlinear capacitance effect with signal and bias levels for the parallel combination of the gate to drain and gate to channel capacitances.

More particularly, the core of the present invention is the MOS device nonlinear capacitance. Considering first a typical MOS transistor (see FIG. 1), when the signal across the capacitor is small, the impedance of the MOS transistor is determined by the DC bias setting. If the MOS transistor is biased OFF at DC, this capacitance equals the gate to source and gate to drain overlap capacitances Cgs and/or Cgd (see FIGS. 2, 3 and 4, respectively). If the MOS transistor is biased ON at DC, the capacitance is dominated by the channel capacitance Cg.

Thus when the signal across the MOS transistor is large, the impedance of the MOS transistor changes. If the MOS transistor is biased OFF at DC, the impedance changes from Cgs+Cgd (assuming the connection of FIG. 4) to the channel capacitance Cg for part of the signal swing, assuming the signal swing is large enough. The reverse happens if the MOS transistor is biased ON at DC, where the impedance changes from Cg to the overlap capacitance Cgs+Cgd for part of the signal swing, again assuming the signal swing is large enough. The signal swing required, of course, is dependent on the threshold of the MOS transistor. If two MOS transistors are coupled back-to-back as shown on FIG. 5, a capacitance variation that is symmetrical about a zero AC signal level will occur. Resistor R presents a DC bias path having a high impedance at RF frequencies. If the MOS transistors are biased off for a zero signal level, the series capacitance of the two MOS transistors will increase at large signal amplitudes because of the turn-on of one of the MOS transistors at large positive signal amplitudes, and the turn-on of the other MOS transistor at large negative signal amplitudes. If the MOS transistors are biased on for a zero signal level, the series capacitance of the two MOS transistors will decrease at large signal amplitudes because of the turn-off of one of the MOS transistors at large positive signal amplitudes, and the turn-on of the other MOS transistor at large negative signal amplitudes.

Note that in any of the foregoing cases, the capacitance change at large signal amplitudes can be quite large. If the MOS transistors are biased on at a zero signal level and one turns off at a large signal amplitude, the capacitance will drop from approximately $Cg/2$ to approximately $Cgs$ and/or $Cgd$, a large drop at large signal amplitudes. If the MOS transistors are biased off at zero signal level, then the capacitance will rise at large signal amplitudes from ($Cgs$ and/or $Cgd$)/2 to approximately $Cgs$ and/or $Cgd$, almost doubling.

Figure 5:
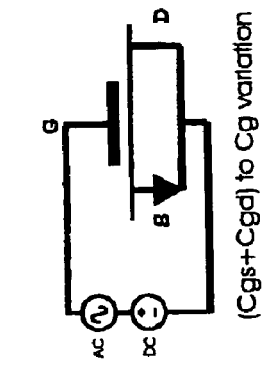
FIG. 5 is a schematic diagram of a pair of MOS transistors illustrating a symmetrical nonlinear capacitance effect with signal and bias levels for the parallel combination of the gate to source, gate to drain and gate to channel capacitances.

In order to provide a controlled DC bias for the MOS transistors as shown in FIG. 5, the transistors normally would be provided in a well or isolated region on the integrated circuit substrate to allow biasing the body (channel) of the transistors as desired. The transistors themselves comprise an insulated gate over a channel region of a first conductivity type and somewhat overlapping source and drain regions of a second conductivity type at opposite ends of the channel region. A depletion mode MOS transistor is turned on by applying a gate voltage which inverts the channel region, providing a layer of minority carriers at the surface of the channel region, which of course are the majority carriers for the source and drain, providing conduction between the source and drain. However, since the present invention does not, in fact, use the MOS transistor in such a conduction mode, the source and drain regions of the second conductivity type can be combined into a single region, thereby allowing electrical connection to that combined region, rather than individual connections to source and drain regions. As such, biasing the gate to turn on a MOS transistor is better considered as biasing an insulated plate (usually polysilicon or metal) to invert the body region thereunder. Consequently, one form of MOS device that may be used in the present invention might simply comprise a body region, typically an isolated body region, of a first conductivity type with at least one region of a second conductivity type therein, with an insulated plate overlapping at least part of the body region and at least part of the region of a second conductivity type.

Figure 6:
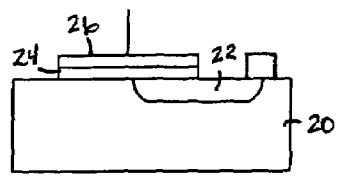
FIG. 6 is a schematic cross section of an exemplary modified MOS device useable as part of the present invention.
Figure 7:
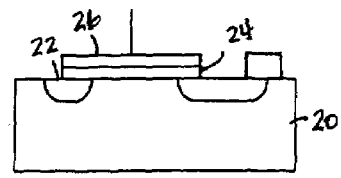
FIG. 7 is a schematic cross section of an exemplary modified MOS device useable as part of the present invention.

An exemplary configuration of this type is schematically illustrated in FIG. 6. As shown therein, the plate 26 is insulated from the body 20 and region 22 of the second conductivity type by an insulated layer 24. The region of the second conductivity type is electrically connected to the body 20. Other configurations may be also used as desired, such as by way of example, the configuration of FIG. 7 wherein region 24 of the second conductivity type essentially encircles the relevant portion of the body 20, with the insulated plate 24 covering the encircled body region and a portion of the region of the second conductivity type. Also, while depletion mode devices have been assumed herein for purposes of discussion, it will be apparent to those skilled in the art that enhancement mode devices may be biased to perform substantially as described. Being alternates to a MOS transistor, the schematic representation of MOS transistors in FIGS. 3–5 and 8–10 are to be understood to include such devices.

Note that in the foregoing discussion, the area of the body region under the insulated plate and the area of overlap of the insulated gate with the region of the second conductivity type are each independently selectable as desired. Also, while not preferred and generally not necessary for advantageous use of the present invention, one could provide separate or contiguous body regions under the insulated plate having different inversion threshold voltages, thereby providing a smoother variation in MOS capacitance with signal magnitude. A similar effect could be obtained in the symmetrical double MOS device configuration of FIG. 5 by coupling a similar second series connected pair of MOS devices in parallel with the first series connected pair and biasing the second series connected pair to a different DC voltage to provide body inversion at a different signal magnitude than for the first pair.

The MOS device impedance variation described provides distortion to a signal applied thereto. When coupled into a circuit having a phase shift dependent on the value of the capacitance, the instantaneous phase shift between the input and the output of the circuit will be dependent on the MOS device capacitance, and be adjustable by adjustment of the biasing of the MOS device(s).

Figure 8:
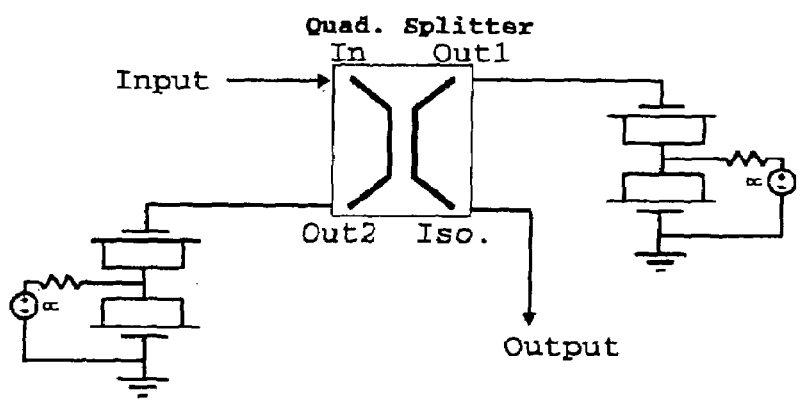
FIG. 8 is a diagram of a phase distortion circuit in accordance wit one embodiment of the present invention.

While any of various phase distortion circuits may be used, one exemplary phase distortion circuit that may be used comprises a signal splitter. When used in conjunction with a signal splitter, such as a Quadrature Hybrid splitter, the impedance variation provides the desired phase distortion. As shown in FIG. 8, a signal may be applied to the input of the splitter, the nonlinear MOS device capacitor (MOS device capacitor pair) is coupled to each of the output ports, and the output signal is taken from the isolation port. Since the MOS impedance is highly reactive, almost all of the input signal is reflected and fed back into the splitter, appearing at the isolation port with little amplitude loss. The variation in the MOS reactance results in the desired phase distortion.

Figure 9:
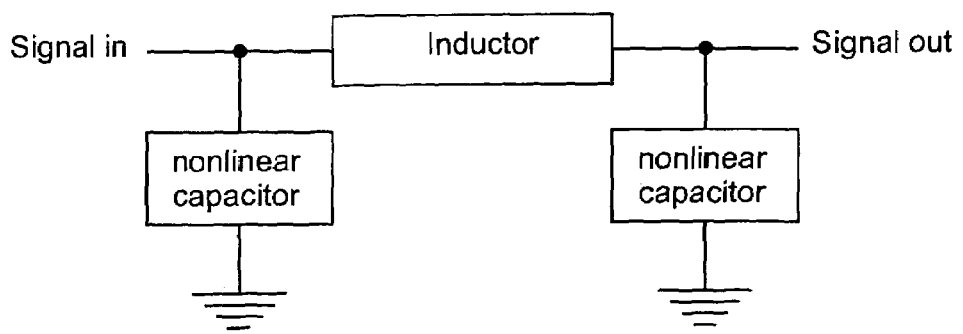
FIG. 9 is a diagram of a phase distortion circuit in accordance wit one embodiment of the present invention.

Another phase distortion circuit using MOS nonlinear capacitors is shown in FIG. 9. Here the back-to-back pairs of nonlinear capacitors in conjunction with the inductor result in a substantial signal magnitude (power) dependent instantaneous phase shift between the input signal and the output signal without significant amplitude distortion. Still other phase distortion circuits will be obvious to those skilled in the art, such as Wheatstone bridges, though such circuits typically have a higher insertion loss than desired. Whatever phase distortion circuit incorporating one or more MOS nonlinear capacitors is used, preferably, but not necessarily, the circuit will have a low insertion loss, and will exhibit the desired adjustable range of signal magnitude or power dependent instantaneous signal phase shift with no more than a nominal or secondary amplitude distortion.

The DC bias level across the MOS devices sets the signal power/voltage level required to switch the MOS devices from a relatively linear mode of operation to a heavily nonlinear mode. The larger the DC voltage, the higher the signal power/voltage required to switch modes. In some applications, an adjustable decreasing capacitance with signal power/voltage level will be all that is required, whereas in other applications, an adjustable increasing capacitance with signal power/voltage level will be all that is required. However, using the present invention with an appropriate range of bias control, either increasing or decreasing capacitance with signal power/voltage level can be achieved with the same circuit, making one circuit applicable to either of the foregoing applications, and to applications wherein the need is not known a proiri.

The level of distortion produced by a MOS device may be controlled by controlling the ratio of the body area of the first conductivity type under the insulated plate to the area of the region of the second conductivity type under the plate. The combination of the threshold voltage for inversion and the bias voltage determines the signal amplitude at which the greatest change in capacitance occurs. However it is also convenient to design a phase distorter of sufficient distortion range, and to then reduce the distortion as appropriate for a specific application. By way of example, putting a linear capacitance in parallel or in series with the nonlinear MOS device reduces the level of distortion produced (see FIG. 10). Normally with the present invention, as the signal power level increases, the distortion level increases by a certain rate. A parallel or series capacitor reduces this rate. The linear capacitance can be generated by using a capacitor, varactor diode or any other such device, typically integrated as part of the same integrated circuit. Such setting of the rate of distortion increase in response to a signal power/voltage level increase may be referred to as the slope setting. Also, a plurality of such devices may be fabricated on the same integrated circuit, perhaps in a binary progression, and switched into the phase distortion circuit as needed to trim the phase distortion to achieve the desired distortion. Similarly, the bias voltage or voltages may be trimmed as necessary or desired for a particular application.

Using two MOS devices back-to-back (FIGS. 5, 8 and 10) effects both the positive and negative cycle of the waveform symmetrically, and thus does not generate second harmonics in the output, whereas using a single MOS device causes unsymmetrical distortion and generates second harmonics. In many applications, the second harmonics are out of the frequency range of interest, and accordingly may be ignored, or alternatively, filtered out. Consequently, whether a single MOS device or back-to-back MOS devices need be used will depend on the application. Further, in some distortion circuits in which the present invention may be used, such as, by way of example, a Wheatstone bridge or perhaps the circuits of FIGS. 8, 9 and 10, use of a single nonlinear capacitor in one location in the circuit oriented to effect a signal of one polarity and use of another single nonlinear capacitor in another location in the circuit oriented to effect a signal of the opposite polarity may also reduce or eliminate the second harmonic without requiring actual back-to-back devices. Finally, if a smother first order distortion is needed for a single MOS device, a second MOS device could be placed in parallel with the first MOS device and biased to a different bias level.

Figure 10:
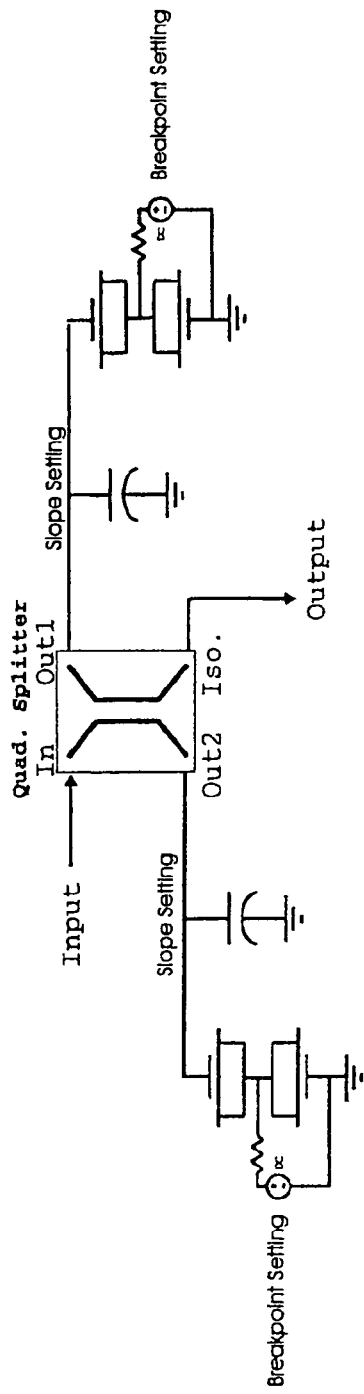
FIG. 10 is a diagram similar to FIG. 8 together with an additional linear capacitor for slope setting purposes.
Figure 11:
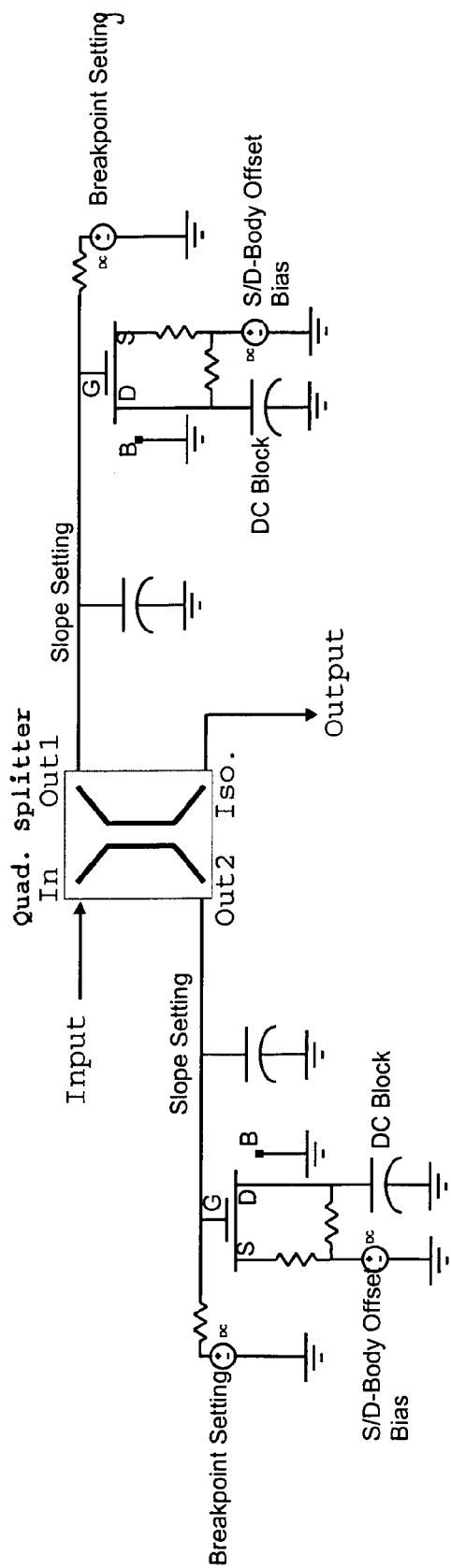
FIG. 11 is an embodiment similar to that of FIGS. 8 and 10, though using single MOS devices rather than back-to-back devices, and effectively using a MOS device as a three terminal device by separately biasing the bulk or body of the MOS device to provide an additional margin against forward biasing a MOS device body diode.

Now referring to FIG. 11, an embodiment of the present invention similar to that of FIGS. 8 and 10 may be seen. This embodiment is configured for a specific application, and accordingly, similar embodiments may be differently configured for other applications, as desired. In particular, in this embodiment, the MOS devices are biased on and turn off for larger signal voltage swings for phase expansion purposes (different biasing may be used, of course, for phase compression circuits as desired). In the embodiment of FIG. 11, the MOS devices Q1 and Q2 are configured like MOS transistors, having a gate G, a source S and a drain D, specifically each like an n-channel MOS transistor. However, unlike many MOS transistors, the body or bulk B of each transistor is provided on a separate terminal, which in this embodiment is connected to ground. Both the sources and the drains are biased above the bulk by DC voltages S/D-BODYOFFSET. The S/D-BODYOFFSET voltages are coupled to the source and drain through resistors, at least the resistors coupled to the sources having a relatively high impedance at the RF frequencies of interest. The sources, however, are coupled through capacitors DCBLOCK that effectively couple the drain capacitances to RF ground. The sources S are not similarly coupled, as the linear component of the MOS device capacitances is preferably kept to a minimum in this application. On the other hand, the biasing of both the sources and the drains to a voltage substantially above the voltage on the transistor bodies or bulk provides room for a substantial voltage swing, particularly of the sources S, without risk of forward biasing the inherent source body diodes. The gates G, biased relative to the bodies or bulk B, are set by the break point settings, providing a DC voltage through coupling resistors to the gates, again the coupling resistors being relatively high impedance resistors at the RF signal frequencies. Finally, linear slope setting capacitors are selected to control the extent of phase expansion obtained as desired for the application.

Thus, in comparison to the embodiments of FIGS. 8 and 10, the MOS devices of the embodiment of FIG. 11 are four terminal devices, gates G, sources S, drains D and bodies or bulk B, though only three terminals (gate, drain and bulk) are active at the RF frequencies, the sources substantially floating with respect to the RF signal. Such independent control of the DC bias of the MOS devices bulk or bodies may be advantageous in other embodiments also. Further, in the embodiment of FIG. 11, individual MOS devices are used, as opposed to the back-to-back devices of FIGS. 8 and 10, as the specific application for the embodiment of FIG. 11 does not require suppression of the second harmonic.

As stated before, the preferred embodiments of the present invention controllable phase distortion circuits are primarily intended for use as pre and/or post RF amplifier signal phase distortion, which together with an amplitude distortion circuit, may be used to provide substantially independent adjustment of phase and amplitude of the RF signal.

While certain preferred embodiments of the present invention have been disclosed herein, such disclosure is only for purposes of understanding the exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. In an RF signal phase distortion circuit, the improvement comprising:

a MOS device having a body of a first conductivity type, a region of a second conductivity type in the body, an insulating layer over at least a part of the body and the region of a second conductivity type, and a conductive layer over the insulating layer;

the MOS device being coupled into the RF phase distortion circuit as a nonlinear capacitor having the conductive layer as a first capacitor lead and the region of the second conductivity type as a second capacitor lead;

the RF signal having an amplitude swing inverting the body under the insulating layer for one RF signal amplitude range and not inverting the body under the insulating layer for another RF signal amplitude range.

2. The improvement of claim 1 wherein the body under the insulating layer is inverted for an RF signal having large amplitudes of one polarity and is not inverted for an RF signal having smaller amplitudes of the same polarity and RF signals of the opposite polarity.

3. The improvement of claim 1 wherein the body under the insulating layer is not inverted for an RF signal having large amplitudes of one polarity and is inverted for an RF signal having smaller amplitudes of the same polarity and RF signals of the opposite polarity.

4. The improvement of claim 1 wherein the body is electrically connected to the region of the second conductivity type.

5. The improvement of claim 1 wherein the body is electrically connected to a circuit ground.

6. The improvement of claim 5 wherein the region of the second conductivity type is RF coupled to a circuit ground and DC biased to a voltage other than the circuit ground.

7. The improvement of claim 1 wherein the phase distortion circuit includes first and second MOS devices.

8. The improvement of claim 7 wherein the MOS devices are connected to the phase distortion circuit in different places.

9. The improvement of claim 7 wherein the MOS devices are coupled in series, back-to-back.

10. The improvement of claim 9 wherein the first capacitor lead of the first MOS device is coupled to a circuit ground, the body is coupled to the second capacitor lead of both the first and second MOS devices, and the first capacitor lead of the second MOS device is coupled to the phase distortion circuit, the second capacitor leads being biased to a voltage other than a circuit ground.

11. An RF signal phase distortion circuit comprising:
    a quad splitter having an input connection, a first output connection, a second output connection and an isolation connection;
    the input connection being coupled to receive an RF signal input, the isolation connection being coupled to provide an RF signal output;
    first and second MOS devices, each having a body of a first conductivity type, a region of a second conductivity type in the body, an insulating layer over at least a part of the body and the region of a second conductivity type, and a conductive layer over the insulating layer;
    the first MOS device having its conductive layer coupled to the first output connection and its region of a second conductivity type coupled to an RF ground;
    the second MOS device having its conductive layer coupled to the second output connection and its region of a second conductivity type coupled to an RF ground;
    the body of the first and second MOS devices being coupled to a circuit ground;
    for the first MOS device, the RF signal having an amplitude swing inverting the body under the insulating layer for one RF signal amplitude range and not inverting the body under the insulating layer for another RF signal amplitude range; and,
    for the second MOS device, the RF signal having an amplitude swing inverting the body under the insulating layer for one RF signal amplitude range and not inverting the body under the insulating layer for another RF signal amplitude range.

12. The RF signal phase distortion circuit of claim 11 further comprising first biasing circuitry biasing the region of the second conductivity type of the first MOS device to a DC voltage; and,
    second biasing circuitry biasing the region of the second conductivity type of the second MOS device to a DC voltage.

13. The RF signal phase distortion circuit of claim 11 wherein, for each MOS device, the body under the insulating layer is inverted for an RF signal having large amplitudes of one polarity and is not inverted for an RF signal having smaller amplitudes of the same polarity and RF signals of the opposite polarity.

14. The RF signal phase distortion circuit of claim 11 wherein, for each MOS device, the body under the insulating layer is not inverted for an RF signal having large amplitudes of one polarity and is inverted for an RF signal having smaller amplitudes of the same polarity and RF signals of the opposite polarity.

15. The RF signal phase distortion circuit of claim 11 further comprising a first slope setting capacitor coupled between the insulating layer of the first MOS device and a circuit ground, and a second slope setting capacitor coupled between the insulating layer of the second MOS device and a circuit ground.

16. A method of providing phase distortion in an RF signal comprising:
    providing a MOS device having a body of a first conductivity type, a region of a second conductivity type in the body, an insulating layer over at least a part of the body and the region of a second conductivity type, and a conductive layer over the insulating layer;
    coupling the insulating region and the region of the second conductivity type into a phase distortion circuit as a capacitive element in the circuit;
    providing a bias voltage between the insulating layer and the body so that the RF signal will have an amplitude swing inverting the body under the insulating layer for one RF signal amplitude range and not inverting the body under the insulating layer for another RF signal amplitude range.

17. The method of claim 16 wherein the bias voltage is set so that the body under the insulating layer is inverted for an RF signal having large amplitudes of one polarity and is not inverted for an RF signal having smaller amplitudes of the same polarity and RF signals of the opposite polarity.

18. The method of claim 16 wherein the bias is set so that the body under the insulating layer is not inverted for an RF signal having large amplitudes of one polarity and is inverted for an RF signal having smaller amplitudes of the same polarity and RF signals of the opposite polarity.

19. The method of claim 16 wherein the method is practiced using a plurality of MOS devices.

20. The method of claim 19 wherein each of the plurality of MOS devices is used in a different part of the phase distortion circuit.

21. The method of claim 19 wherein two MOS devices are connected back-to-back to provide symmetrical phase distortion.

22. The method of claim 16 further comprising coupling one or more linear capacitors to the MOS device to trim the extent of phase distortion achieved.

23. The method of claim 16 further comprising coupling one or more linear capacitors between the region of the second conductivity type and the conductive layer to trim the extent of phase distortion achieved.

* * * * *